US009356175B2

(12) United States Patent
Storbeck et al.

(10) Patent No.: US 9,356,175 B2
(45) Date of Patent: May 31, 2016

(54) PHOTOVOLTAIC MODULE, METHOD FOR ELECTRICALLY CONNECTING A PLURALITY OF PHOTOVOLTAIC CELLS, AND DEVICE FOR ELECTRICALLY CONNECTING A PLURALITY OF PHOTOVOLTAIC CELLS

(75) Inventors: Olaf Storbeck, Dresden (DE); Martin Kutzer, Penig (DE); Harald Hahn, Dresden (DE); Holger Neuhaus, Freiberg (DE)

(73) Assignee: SOLARWORLD INNOVATIONS GMBH, Freiberg (DE)

( * ) Notice: Subject to any disclaimer, the term of this patent is extended or adjusted under 35 U.S.C. 154(b) by 109 days.

(21) Appl. No.: 13/095,930

(22) Filed: Apr. 28, 2011

(65) Prior Publication Data
US 2011/0265844 A1 Nov. 3, 2011

(30) Foreign Application Priority Data

Apr. 28, 2010 (DE) .......................... 10 2010 016 675

(51) Int. Cl.
*H01L 31/044* (2014.01)
*H01L 31/05* (2014.01)
*H02S 10/10* (2014.01)

(52) U.S. Cl.
CPC ............ *H01L 31/0504* (2013.01); *H02S 10/10* (2014.12); *Y02E 10/50* (2013.01); *Y10T 29/5313* (2015.01)

(58) Field of Classification Search
CPC ........ H01L 31/00–31/078; Y02E 10/50–10/60
USPC ................................................ 136/243–265
See application file for complete search history.

(56) References Cited

U.S. PATENT DOCUMENTS

| 3,819,417 | A | * | 6/1974 | Haynos ......................... 136/244 |
| 4,617,722 | A | * | 10/1986 | Willis .............................. 438/61 |
| 5,620,528 | A | * | 4/1997 | Schade et al. ................. 136/244 |
| 7,432,438 | B2 | | 10/2008 | Rubin et al. |
| 8,257,998 | B2 | * | 9/2012 | Sachs et al. ...................... 438/71 |
| 8,426,726 | B2 | | 4/2013 | Taira et al. |
| 2001/0023702 | A1 | * | 9/2001 | Nakagawa et al. ........... 136/244 |
| 2004/0200522 | A1 | * | 10/2004 | Fukawa et al. ................ 136/259 |
| 2007/0175509 | A1 | * | 8/2007 | Yagiura et al. ................ 136/256 |
| 2008/0216887 | A1 | | 9/2008 | Hacke et al. |
| 2008/0227236 | A1 | * | 9/2008 | Luch ............................. 438/73 |
| 2009/0183759 | A1 | | 7/2009 | Hishida |

(Continued)

FOREIGN PATENT DOCUMENTS

DE 3612269 A1 10/1987
DE 4435219 C1 1/1996

(Continued)

OTHER PUBLICATIONS

English language abstract of DE 10 2008 060 651 A1.

(Continued)

*Primary Examiner* — Bach Dinh

(57) ABSTRACT

In various embodiments, a photovoltaic module may include: a plurality of photovoltaic cells, at least one photovoltaic cell of the number of photovoltaic cells comprising: a first plurality of contact wires on a front of the photovoltaic cell; and a second plurality of contact wires on a rear of the photovoltaic cell. The first plurality of contact wires and the second plurality of contact wires may be arranged offset with respect to one another.

10 Claims, 10 Drawing Sheets

(56) References Cited

U.S. PATENT DOCUMENTS

2010/0089435 A1* 4/2010 Lockenhoff .............. 136/246
2010/0282292 A1* 11/2010 Malik .................... 136/244

FOREIGN PATENT DOCUMENTS

| | | |
|---|---|---|
| DE | 19804877 A1 | 8/1999 |
| DE | 10239845 C1 | 12/2003 |
| DE | 102007022877 A1 | 11/2008 |
| DE | 102008015383 A1 | 9/2009 |
| DE | 102008043833 A1 | 5/2010 |
| DE | 102008060651 A1 | 6/2010 |
| JP | 2002319691 A | 10/2002 |
| JP | 2005244171 A | 9/2005 |
| JP | 2009176782 A | 8/2009 |
| JP | 2009206366 A | 9/2009 |
| JP | 2009206493 A | 9/2009 |
| JP | 2009260202 A | 11/2009 |

OTHER PUBLICATIONS

English language abstract of DE 10 2008 043 833 A1.
English language abstract of DE 10 2007 022 877 A1.
English language abstract of JP 2009260202 a dated Nov. 5, 2009.
English language abstract of JP 2005244171 A dated Sep. 8, 2005.
English abstract of DE 102008015383 A1 dated Sep. 24, 2009.
English abstract of DE 3612269 A1 dated Oct. 15, 1987.
English abstract of DE 19804877 A1 dated Aug. 12, 1999.
Notice of Allowance for Korean Application No. 2011-0039703; Aug. 29, 2013; 3 pages (with translation).

* cited by examiner

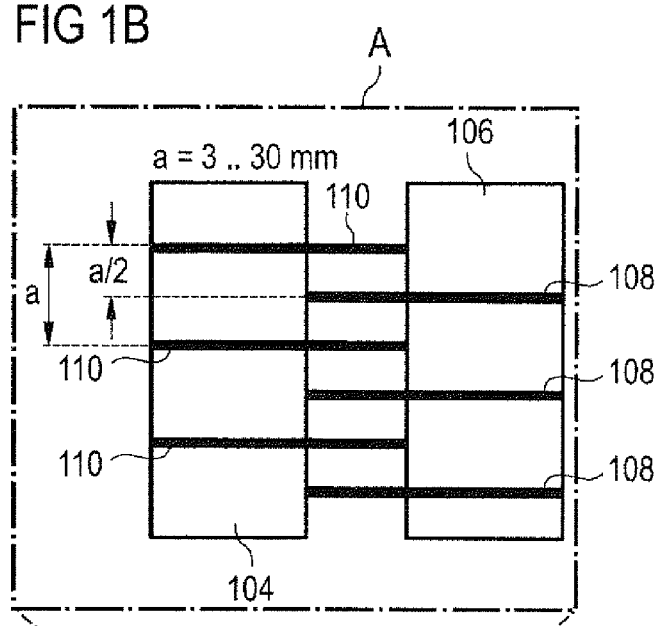
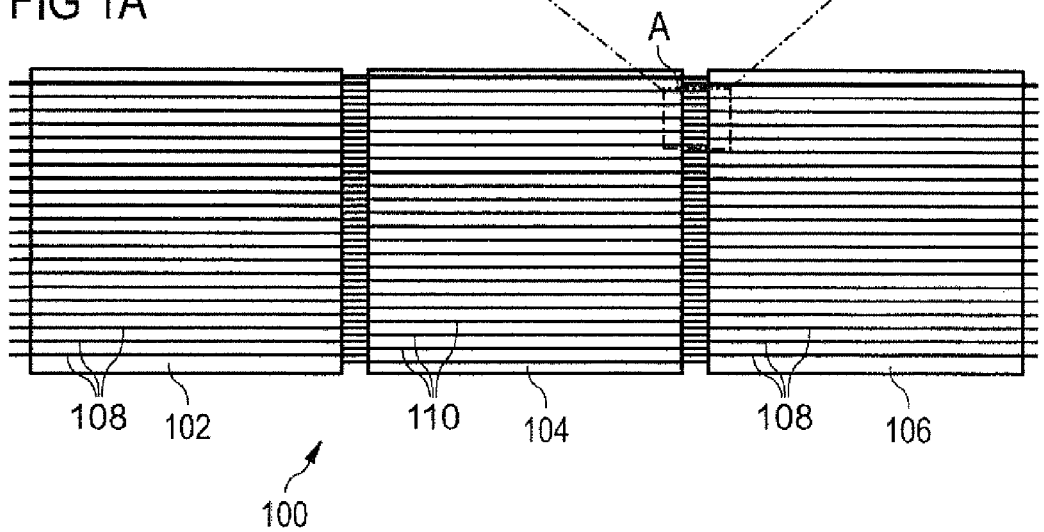

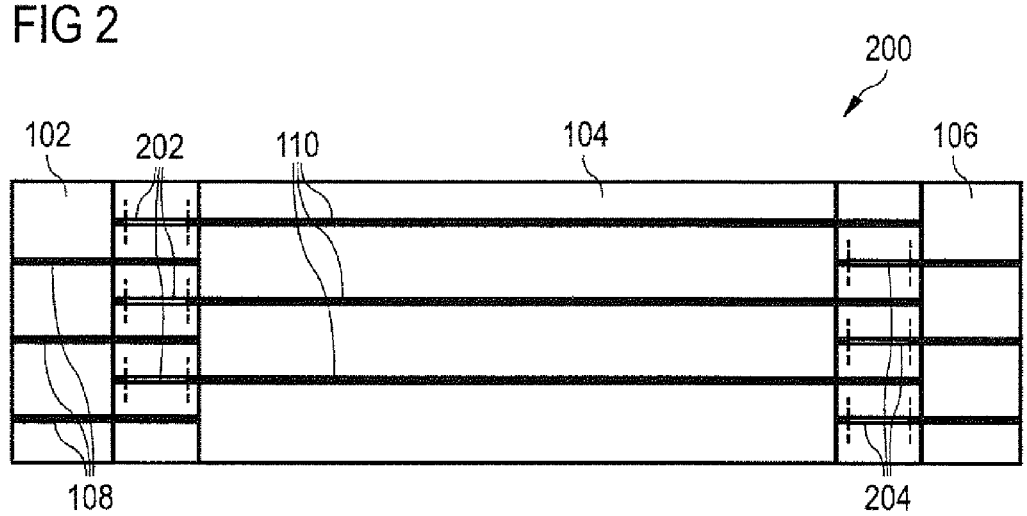

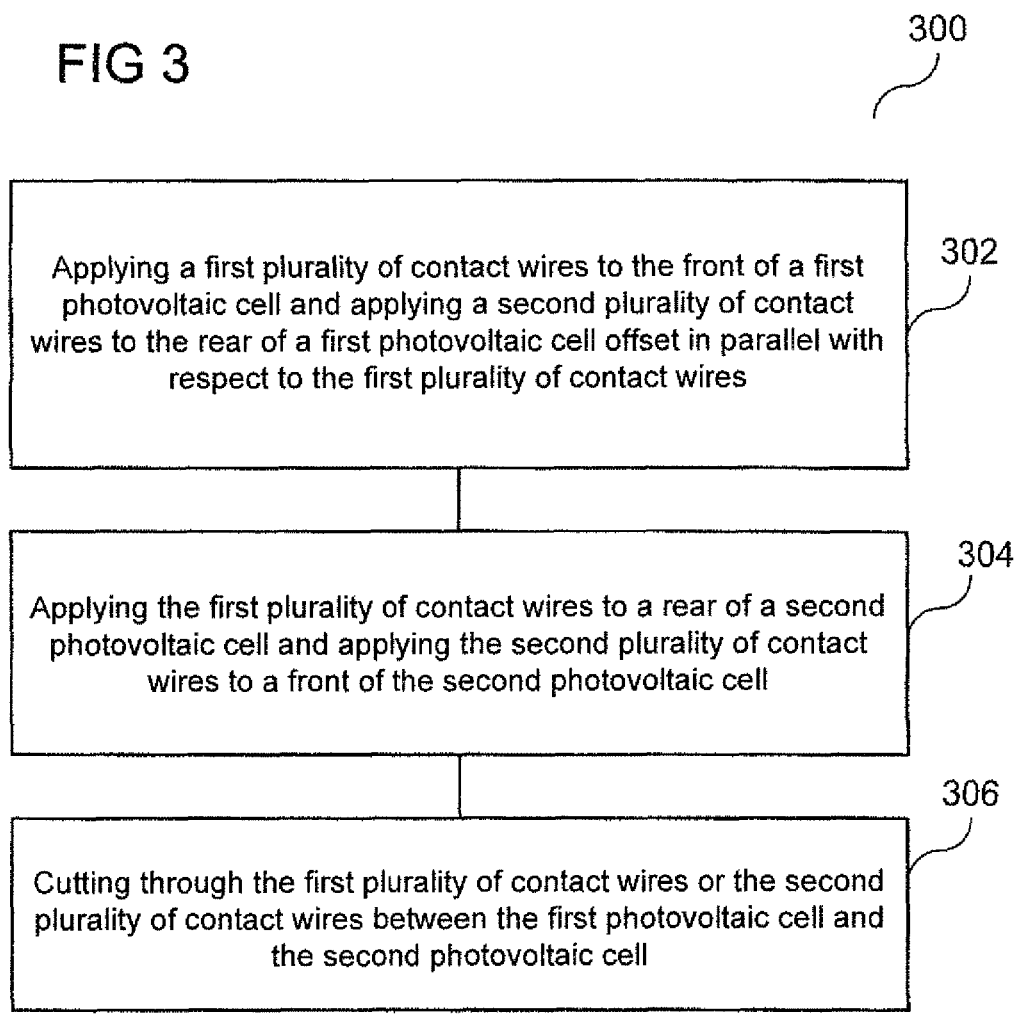

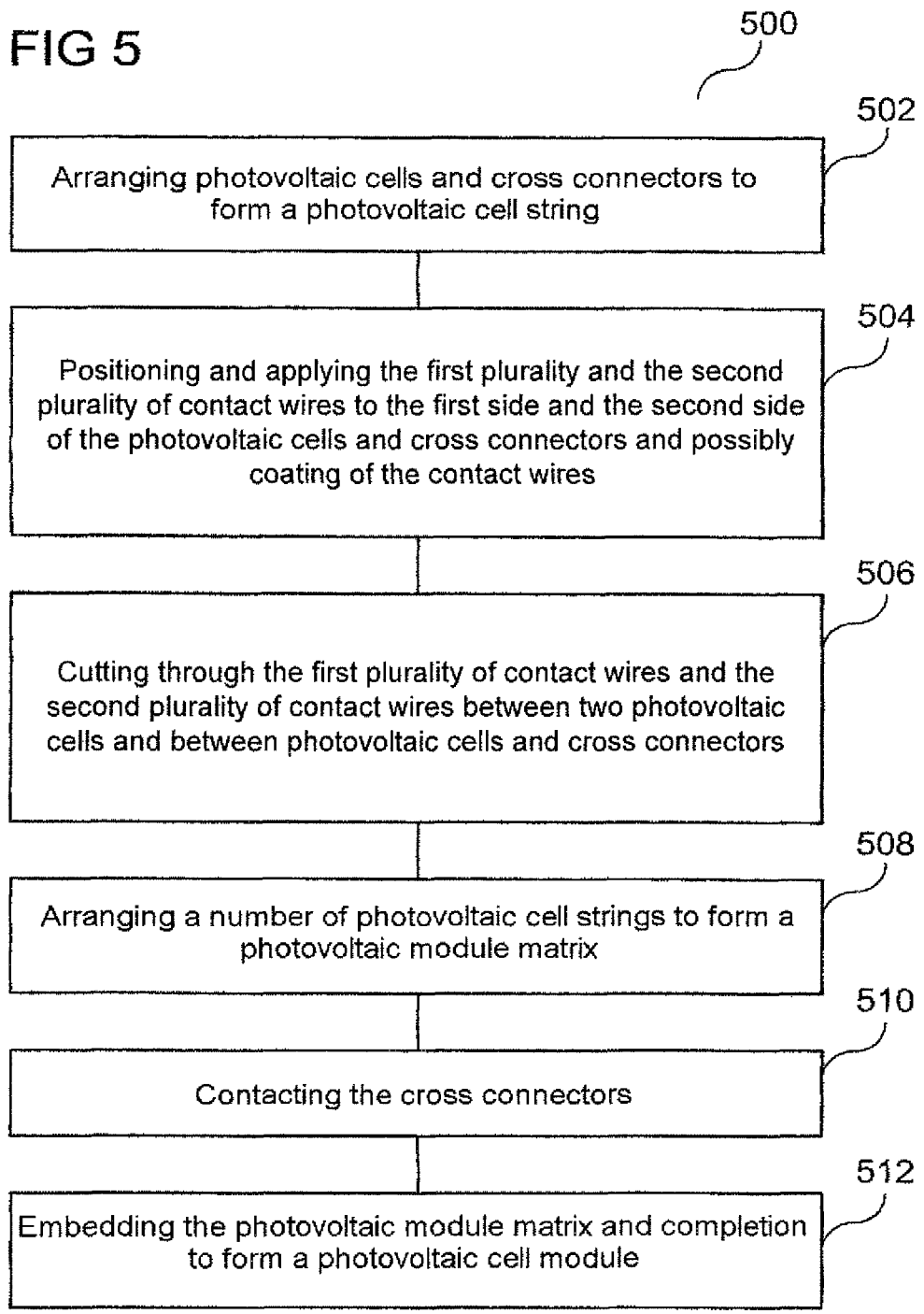

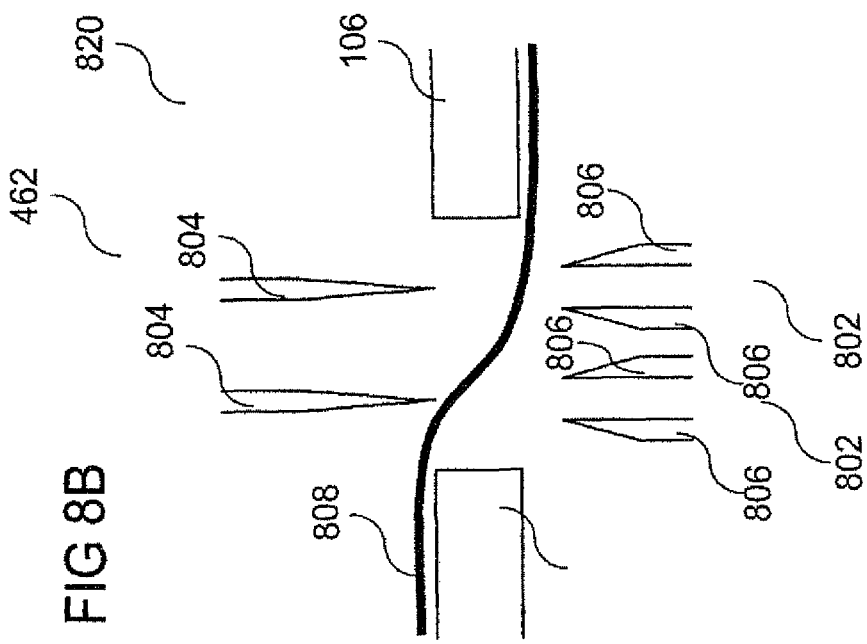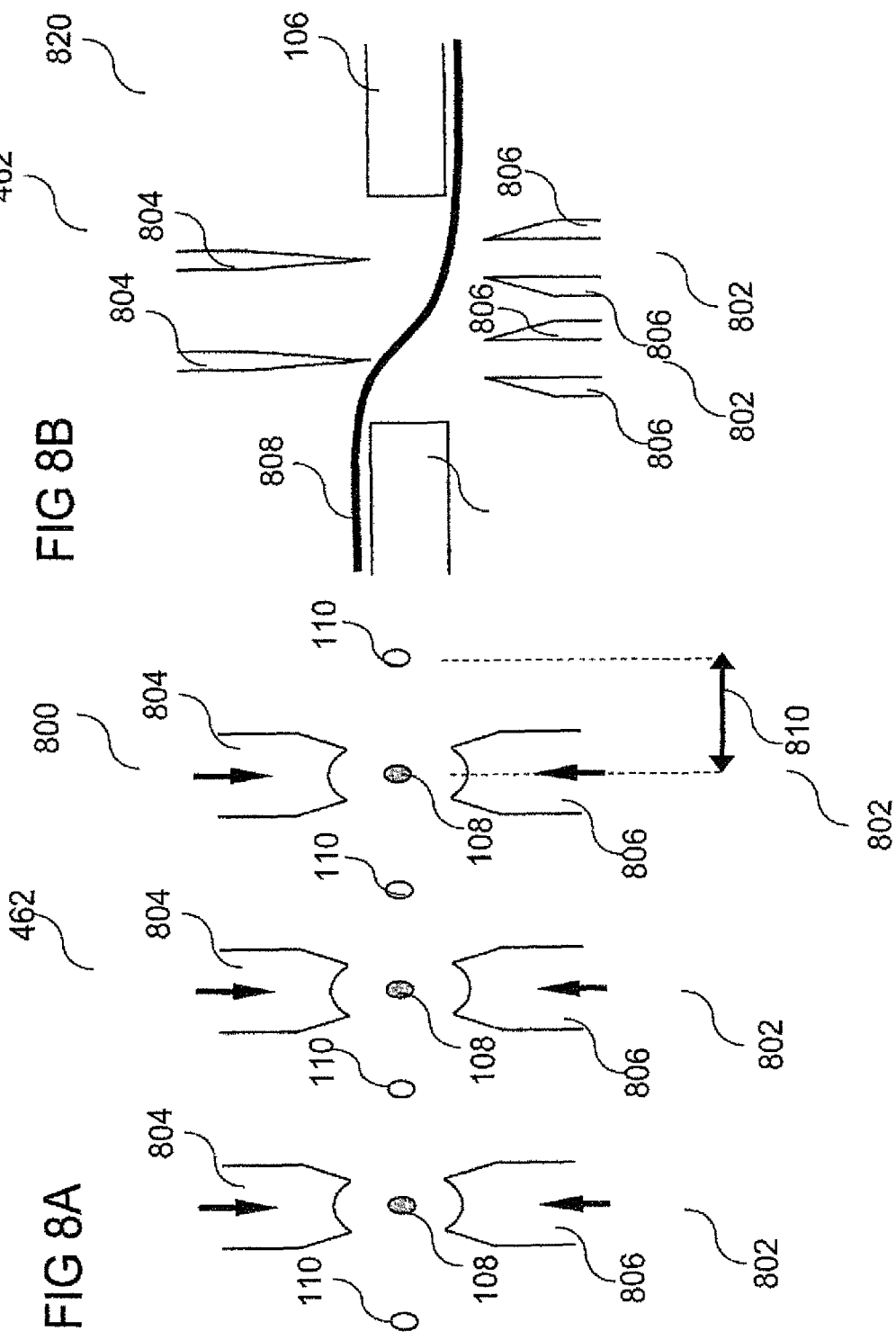

PHOTOVOLTAIC MODULE, METHOD FOR ELECTRICALLY CONNECTING A PLURALITY OF PHOTOVOLTAIC CELLS, AND DEVICE FOR ELECTRICALLY CONNECTING A PLURALITY OF PHOTOVOLTAIC CELLS

CROSS-REFERENCE TO RELATED APPLICATION

This application claims priority to German Patent Application Serial No. 10 2010 016 675.8, which was filed Apr. 28, 2010, and is incorporated herein by reference in its entirety.

TECHNICAL FIELD

Various embodiments relate to a photovoltaic module, a method for electrically connecting a plurality of photovoltaic cells, and to a device for electrically connecting a plurality of photovoltaic cells.

BACKGROUND

A photovoltaic cell (for example a solar cell) usually exhibits a layer of semiconductor material, for example silicon (also called photovoltaic layer in the text which follows). The photovoltaic layer exhibits a front (also called emitter side) and a rear, an (electrically conductive) contact pattern (for example in the form of so-called contact fingers) being applied to at least one of the two sides. The contact pattern typically has a width of at least 100 µm whilst its thickness is only about 10 µm to 15 µm. A greater width of the contact pattern leads to a reduction in the efficiency due to the resultant increased shading whilst a reduction in width results in the disadvantage that the line resistance of the contact pattern is increased. Furthermore, the current of the individual contact patterns is combined in so-called busbars as a result of which further shading of the front surface is caused.

Photovoltaic cells (for example solar cells) are generally interconnected by means of contact strips which are soldered to the busbars of the photovoltaic cell (for example solar cell). In this context, the entire current is conducted through the contact strips. To keep the resistance losses as low as possible, a certain total cross-sectional area of these contact strips is required. This results in a loss of power due to the shading on the front. A further disadvantage consists in that the busbar exerts mechanical stresses on the paste-wafer junction during soldering which can lead to a fracture of the photovoltaic cell.

To create an improved photovoltaic module, the contact pattern of the photovoltaic cell (for example solar cell) and the number and dimension of the contact strips (also called contact wires in the text which follows) should thus be optimized in combination.

In this context, it has been found that good optimization is obtained for many thin parallel contact wires. It can also be expected that due to the wires being fixed at selective points on the photovoltaic cell (for example solar cell) lower mechanical stresses are built up due to the different thermal coefficients of expansion of wire and photovoltaic cell (for example solar cell).

One problem in this is the handling and positioning of the thin contact wires on the photovoltaic cell (for example solar cell).

In patent specification DE 102 39 845 C1, a method is described in which the contact wires are fixed on an optically transparent film with the aid of an optically transparent adhesive and are subsequently fixed on the metallization of a solar cell. In this arrangement, film and adhesive remain in the solar cell module which implies relatively high demands on the adhesive and the film with regard to long-term stability and, as a result, causes relatively high costs. In this method, the wires are embedded in an optical transparent polymer carrier material and connected to the solar cell, the polymer auxiliary material being used for improving the manageability.

SUMMARY

In various embodiments, a photovoltaic module may include: a plurality of photovoltaic cells, at least one photovoltaic cell of the number of photovoltaic cells comprising: a first plurality of contact wires on a front of the photovoltaic cell; and a second plurality of contact wires on a rear of the photovoltaic cell. The first plurality of contact wires and the second plurality of contact wires may be arranged offset with respect to one another.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1A shows a part of a photovoltaic cell string of a photovoltaic module to be formed, according to an embodiment;

FIG. 1B shows an enlarged section of the part of the photovoltaic cell string according to FIG. 1A;

FIG. 2 shows a top view of a number of photovoltaic cells of a photovoltaic module according to an embodiment, in which the cutting-through of contact wires between in each case two mutually adjacent photovoltaic cells is shown;

FIG. 3 shows a flowchart in which a method for electrically connecting a plurality of photovoltaic cells according to one embodiment is shown;

FIG. 5 shows a flowchart in which a method for electrically connecting a plurality of photovoltaic cells according to one embodiment is shown;

FIGS. 8A and 8B show a representation of a mechanical contact wire cutting device in a longitudinal view (FIG. 8A) and cross-sectional view (FIG. 8B) according to one embodiment;

DESCRIPTION

Figure 4B:
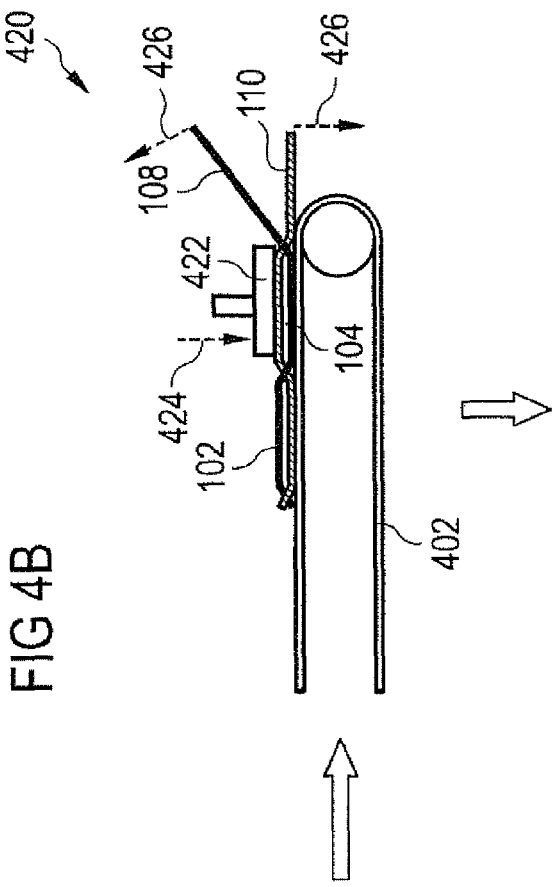
FIGS. 4A to 4D show a device for generating an electrically conductive contact of a number of photovoltaic cells according to one embodiment in a number of states of contact-making.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

In the following detailed description, reference is made to the attached drawings which form part of it and in which specific embodiments, in which the invention can be performed, are shown for the purpose of illustration. In this respect, directional terminology such as "top", "bottom", "front", "rear" etc. is used with reference to the orientation of the figure(s) described. Since components of embodiments can be positioned in a number of different orientations, the directional terminology is used for illustration and is in no way restrictive. Naturally, other embodiments can be used and structural or logical changes can be performed without deviating from the range of protection of the present invention. Naturally, the features of the various embodiments described herein can be combined with one another unless specifically specified differently. The following detailed description should therefore not be understood to be restrictive and the range of protection of the present invention is defined by the attached claims.

Within the context of the present description, the terms "joint", "connected" and "coupled" are used for describing both a direct and an indirect joint, a direct or indirect connection and a direct or indirect coupling. In the figures, identical or similar elements are provided with identical reference symbols insofar as this is appropriate.

In various embodiments, a photovoltaic cell is understood to be a device which converts radiation energy (in the case of a solar cell, for example, from predominantly visible light (it must be noted that ultraviolet(UV) radiation and/or infrared (IR) radiation may also be additionally converted) for example from sunlight) directly into electrical energy by means of the so-called photovoltaic effect.

In various embodiments, a photovoltaic module is understood to be an electrically connectable device including a number of photovoltaic cells, and optionally with weather protection (for example glass), an embedment and a frame structure.

In various embodiments, a product (photovoltaic cell string (for example a solar cell string)/photovoltaic module (for example solar module)), a method and a system for interconnecting photovoltaic cells (for example solar cells) are provided.

In various embodiments, a frontal—rear contact is generated for strings of photovoltaic cells (for example solar cells) by means of arrays of largely parallel thin contact wires (also called contact wire arrays) in order to make contact electrically with a photovoltaic cell (for example solar cell) by means of many thin contact wires, various embodiments managing without an optically transparent film as support material.

The embodiments described in the text which follows lead to a photovoltaic module with a novel connection of the photovoltaic cells in the photovoltaic module. The novel interconnection is found in the photovoltaic module, for example descriptively by means of an offset arrangement of the contact wires of contact wire arrays on the same side of two adjacent photovoltaic cells in a photovoltaic cell string or also by an offset arrangement of the contact wires of contact wire arrays on the front or rear of the same photovoltaic cell and distinguishes it from other similar products. In various embodiments, it is possible to work with a contact wire array and to dispense with using an auxiliary material, for example a support material.

The photovoltaic cells used in various embodiments have, for example, no busbars (which, however, may be provided in alternative embodiments if desired) but only, possibly modified contact fingers (also called grid fingers) (e.g. with a contact finger widened at the front at the photovoltaic cell edge) and busbars modified at the rear and attached transversely to the direction of interconnection. The usual mirror symmetry of photovoltaic cells with respect to the direction of interconnection may also be canceled in order to adapt the contact pattern to the alternating offset of the two wire arrays. The photovoltaic cell shape does not mandatorily need to be square, rectangular shapes are also conceivable or even advantageous. Round or arbitrary shapes are also provided in various embodiments. Since the two contact wire arrays are arranged offset with respect to one another, it can also be provided in various embodiments that the photovoltaic cell no longer needs to be arranged to be symmetric in the direction of the contact wire (in other words in the direction of extent of the contact wires) but also the contact pattern(s) is (are) alternatingly adapted depending on the offset of the contact wire array.

FIG. 1A shows a part of a prefabricated photovoltaic cell string 100 (for example an intermediate product of the production of photovoltaic cell strings and photovoltaic modules, for example solar modules) according to one embodiment, and FIG. 1B shows an enlarged section A of the part of the intermediate photovoltaic cell string product 100 according to FIG. 1A.

In various embodiments, the intermediate product 100, in other words the photovoltaic cell string 100, includes a number of photovoltaic cells 102, 104, 106 (for example a number of solar cells 102, 104, 106). At least one (in various embodiments all) of the photovoltaic cells 102, 104, 106 may include: a first plurality of contact wires 108 (also called first contact wire array 108 in the text which follows) on a first side (for example a front, also called emitter side or sun side) of the photovoltaic cell 102, 104, 106. The respective photovoltaic cell 102, 104, 106 may also include a second plurality of contact wires 110 (also called second contact wire array 110 in the text which follows) on a second side (opposite to the first side) (for example a rear) of the photovoltaic cell 102, 104, 106. The first plurality of contact wires 108 and the second plurality of contact wires 110 may be arranged offset with respect to one another. The number of contact wires of the first contact wire array 108 may be equal to the number of contact wires of the second contact wire array 110 or different from it (smaller or larger).

The photovoltaic cells 102, 104, 106 may include in each case a layer of semiconductor material, for example silicon, also called photovoltaic layer in the text which follows. The photovoltaic layer exhibits a front (also called emitter side) and a rear. The photovoltaic layer may include or consist of semiconductor material (such as, for example, silicon), compound semiconductor material (such as, for example, III-V-compound semiconductor material (such as, for example, GaAs), II-VI-compound semiconductor material (such as, for example, CdTe), I-III-V-compound semiconductor material (such as, for example, copper-indium-disulfide). As an alternative, the photovoltaic layer may include or consist of an organic material. In various embodiments, the silicon may include or consist of monocrystalline silicon, polycrystalline silicon, amorphous silicon and/or microcrystalline silicon. The photovoltaic layer may include a semiconductor junction such as, for example, a pn-junction pattern, a pin-junction pattern, a Schottky-junction pattern or the like.

Furthermore, an antireflection layer, for example of silicon nitride or an arbitrary other suitable material, may be provided on the photovoltaic layer or the optional light-transparent electrically conductive layer.

Furthermore, a contact pattern or a number of contact patterns, for example in the form of electrically conductive contact patterns, (for example in the form of contact fingers) may be applied to the photovoltaic cell, wherein the contact pattern(s) may be formed by an electrically conductive paste which can be fired before, during or after the application of the contact wires into the antireflection layer in various embodiments so that an electrical connection may be formed between the contact wires and the photovoltaic layer by means of the electrically conductive contact patterns. Furthermore, electrically conductive contact patterns may also be provided on the rear of the photovoltaic cell.

The contact pattern(s) may be applied to be line-shaped, segmented-line-shaped or point-shaped. In various embodiments, the contact pattern(s), for example the individual contact fingers, may in each case include a width of at least 25 µm, for example a width of at least 100 µm. The thickness of the contact patterns 208 may be within a range of approximately 5 µm up to approximately 50 µm, for example within a range of approximately 10 µm to approximately 15 µm.

The contact pattern(s) may be applied by means of a contact pattern application device (not shown), wherein the contact pattern application device may be arranged for applying the contact pattern by means of a screen printing method or by means of an extrusion printing method. Thus, according to various configurations the contact pattern application device may descriptively exhibit a screen printing device or an extrusion printing device (for example with a plurality of extrusion printing heads). Furthermore, the contact pattern(s) may be formed by an electrochemical or galvanic deposition.

According to various embodiments, the first plurality of contact wires 108 and the second plurality of contact wires 110 are arranged to be offset with respect to one another, for example offset with respect to one another by approximately one half of the distance a of two contact wires. According to various embodiments, the contact wires of the first contact wire array 108 may be arranged at a distance a from one another within a range of approximately 1 mm to approximately 50 mm, for example within a range of approximately 3 mm up to approximately 30 mm. Furthermore, according to various embodiments, the contact wires of the second contact wire array 110 may be arranged at a distance a from one another within a range of approximately 1 mm to approximately 50 mm, for example within a range of approximately 3 mm up to approximately 30 mm. According to various embodiments, the first plurality of contact wires and the second plurality of contact wires may be arranged offset with respect to one another, for example by a distance of approximately 0.5 mm to approximately 25 mm, for example arranged to be offset with respect to one another by a distance of approximately 1.5 mm to approximately 15 mm.

The contact wire arrays 108, 110 may include in each case a plurality or multiplicity of contact wires, for example approximately 3 contact wires to approximately 90 contact wires, for example approximately 5 contact wires up to approximately 50 contact wires, for example approximately 20 contact wires.

In various embodiments, thin contact wires are provided, the contact wires exhibiting, for example, a diameter of less than 400 µm, for example a diameter of less than 350 µm, for example a diameter of less than 300 µm, for example a diameter of less than 250 µm. The contact wires of the contact wire arrays 108, 110 may essentially extend in parallel with one another, as an alternative at an angle with respect to one another, wherein the contact wires, however, do not touch along their longitudinal extent in various embodiments. The contact wires can be arranged for collecting and transmitting electrical energy, for example electrical current, which is generated by the respective photovoltaic cell 102, 104, 106, for example by the respective at least one photovoltaic layer.

The contact wires may include or consist of electrically conductive material, for example metallically conductive material, which may include or may consist of one or more of the following metals: Cu, Al, Au, Pt, Ag, Pb, Sn, Fe, Ni, Co, Zn, Ti, Mo, W, and/or Bi. The contact wires may include or consist of a metal selected from a group consisting of: Cu, Au, Ag, Pb and Sn. Furthermore, the contact wires may be coated with a metal or a metal alloy, for example with silver and/or nickel. The contact wires may be constructed as copper wires which, for example, are provided with a diffusion bather layer (e.g. of Ni, Co) and/or a solder layer (e.g. Sn, Ag, Sn—Ag, Sn—Pb, Sn—Bi).

The contact wires may generally include an arbitrary cross section such as, for example, a round cross section, an oval cross section, a triangular cross section, a rectangular cross section (for example a square cross section), or a cross section of any arbitrary other polygonal shape. The contact wires may also include a patterned surface.

The interconnection of the photovoltaic cells 102, 104, 106 leads to photovoltaic cell strings of different length of, for example, 10 photovoltaic cells (in alternative embodiments, a photovoltaic cell string may have a length of 3 photovoltaic cells up to 40 photovoltaic cells, for example a length of 5 photovoltaic cells up to 15 photovoltaic cells), the photovoltaic cell strings may include different arrangements in the photovoltaic module (they may be arranged, for example, in the longitudinal direction or in the transverse direction).

As has been described above, in various embodiments the utilization of two independent contact wire arrays 108, 110 may be provided which, for example, may be arranged offset with respect to one another by approximately one half of the contact wire distance. The two contact wire arrays 108, 110 consist, for example, of in each case 5 contact wires up to 90 contact wires (for example approximately 20 contact wires) in almost equidistant arrangement with a mean contact wire distance within a range of from approximately 1.5 mm up to approximately 30 mm, and with a respective contact wire thickness within a range of, for example, approximately 50 µm up to approximately 300 µm. The cross section of the contact wires may have a different geometry, e.g. round, oval, rectangular, trapezoid, triangular et al.

In various embodiments, the two contact wire arrays 108, 110 may alternate with each photovoltaic cell processed of a photovoltaic cell string, and thus of a photovoltaic module, from the front of a photovoltaic cell to the rear of a respectively immediately adjacent photovoltaic cell and conversely. FIG. 1A and FIG. 1B show the structure of the interconnected photovoltaic cells after the positioning of the contact wire arrays 108, 110. The contact wire arrays 108, 110 are applied descriptively in a weaving-like manner to the photovoltaic cells 102, 104, 106 of a photovoltaic cell string and thus of a photovoltaic module 100.

According to various embodiments, the photovoltaic cells 102, 104, 106 of the photovoltaic module 100 may also include a contact pattern (for example in the form of the electrically conductive contact fingers described above) on the front of the respective photovoltaic cell 102, 104, 106; the first plurality of contact wires 108 being arranged at least partially on the contact pattern. In principle, the contact wires can be arranged at an arbitrary angle to the contact pattern, for example longitudinally (i.e. descriptively essentially in parallel with the contact patterns) or at an angle of 90° (i.e. descriptively essentially perpendicularly to the contact patterns) to the contact pattern.

The first plurality of contact wires 108 may be attached to the front of the photovoltaic cell 102, 104, 106, wherein the second plurality of contact wires 110 may be attached to the rear of the photovoltaic cell 102, 104, 106.

The first plurality of contact wires 108 may be attached to the front (in other words, the emitter side or the sun side) of the photovoltaic cell 102, 104, 106 by means of a solder joint and/or by means of a bonding joint and/or by means of an adhesive joint. The second plurality of contact wires 110 may be attached to the rear of the photovoltaic cell 102, 104, 106 by means of a solder joint and/or by means of a bonding joint and/or by means of an adhesive joint.

One or more edge areas of the photovoltaic cell may be provided with an electrically insulating layer. In this manner, for example, a short circuit may be avoided when splitting contact wires between two adjacent photovoltaic cells 102, 104, 106 by means of a laser arrangement for example as will be described in the text which follows.

According to various embodiments, the photovoltaic module 100 includes a plurality of photovoltaic cells 102, 104, 106, a plurality of contact wires being arranged on a front of each photovoltaic cell 102, 104, 106; the plurality of contact wires of in each case mutually adjacent photovoltaic cells 102, 104, 106 being arranged offset with respect to one another.

Due to the weaving-like application of the contact wire arrays 108, 110 to the front and rear of the photovoltaic cells 102, 104, 106 of the photovoltaic cell string according to the method according to various embodiments, a photovoltaic cell string with unwanted short-circuiting of the photovoltaic cells (for example solar cells) is firstly produced. To bring the photovoltaic cells (for example solar cells) into an electrically meaningful series circuit, it is provided, according to various embodiments, to remove superfluous and disturbing contact wire bridges. For this purpose, the contact wire of each contact wire array (108, 110) is alternately removed in each second photovoltaic cell intermediate space as shown in FIG. 2 in a section 200.

As shown in FIG. 2, the contact wires of the first contact wire array 108 (which is run from the front of a first photovoltaic cells 102 to the rear of a second photovoltaic cell 104 arranged immediately adjacently to the first photovoltaic cell 102 and then again to the front of a third photovoltaic cell 106 which, in turn, is arranged immediately adjacently to the second photovoltaic cell 104) are cut through in an intermediate space between the first photovoltaic cell 102 and the second photovoltaic cell 104 as is symbolized in FIG. 2 by means of first cutting areas 202.

Furthermore, the contact wires of the second contact wire array 110 (which is run from the rear of the first photovoltaic cell 102 to the front of the second photovoltaic cell 104 and then again to the rear of the third photovoltaic cell 106) are cut through in an intermediate space between the second photovoltaic cell 104 and the third photovoltaic cell 106 as is symbolized in FIG. 2 by means of second cutting areas 204. The cutting-through may be carried out by means of a laser or by means of a mechanical cutting device or a mechanical stamping device. Furthermore, a device is provided in various embodiments by means of which cut-out contact wire pieces are removed or sucked off by means of a vacuum device, for example. It is also conceivable to bend the contact wire ends over the previously electrically insulated edges of the photovoltaic cell, for example solar cell, by means of a suitable device after the cutting of the contact wire in order to electrically insulate the contact wire ends from one another.

FIG. 3 shows a flowchart 300 in which the essential steps of a method for connecting a plurality of photovoltaic cells 102, 104, 106 by means of two independent contact wire arrays according to one embodiment are shown.

The method may include in 302 applying of a first plurality of contact wires to the front of a first photovoltaic cell and applying a second plurality of contact wires to the rear of a first photovoltaic cell offset, for example offset in parallel, to the first plurality of contact wires. Both process steps may take place simultaneously or successively in arbitrary order.

Furthermore, in 304, the first plurality of contact wires may be applied to a rear of a second photovoltaic cell after a change of the contact wire array from the front to the rear of the photovoltaic cell, and the second plurality of contact wires may be applied to a front of the second photovoltaic cell after a change of the contact wire array from the rear to the front of the photovoltaic cell. Both process steps may also take place simultaneously or successively in arbitrary order.

Furthermore, it is provided in various embodiments to perform the electrical contacting of the two contact wire arrays with the first photovoltaic cell during this process step, but this may also take place at any later time in the manufacturing process.

It must be pointed out that the mutually offset arranging of the contact wires can be provided at the beginning of the method and that after the contact wires have been arranged, the photovoltaic cells may be pushed between the two majorities of contact wires.

Furthermore, in 306, a cutting-through of the first plurality of contact wires or of the second plurality of contact wires between the first photovoltaic cell and the second photovoltaic cell may be provided.

The first plurality of contact wires 108 and the second plurality of contact wires 110 may be run past one another in each case in a weaving-like manner between the first photovoltaic cell 102 and the second photovoltaic cell 104 and between the second photovoltaic cell 104 and the third photovoltaic cell 106, for example, so that they are in each case alternately run from the front of a photovoltaic cell to the rear of an immediately adjacent photovoltaic cell.

The plurality of contact wires 108, 110 of mutually adjacent photovoltaic cells 102, 104, 106 may be arranged offset with respect to one another in such a manner that they do not laterally overlap. In other words, the plurality of contact wires 108, 110 of in each case mutually adjacent photovoltaic cells 102, 104, 106 may be arranged offset with respect to one another in parallel.

FIG. 4A to FIG. 4D show a device for mechanically connecting and electrically contacting a number of photovoltaic cells in accordance with an embodiment in a number of states of generating a photovoltaic cell string.

Thus, a possible process sequence is described in FIG. 4A to FIG. 4D and may include, for example:

1. Photovoltaic cell deposition and photovoltaic cell positioning;
2. Contacting and contact wire array change;
3. Photovoltaic cell string advance; and
4. Contact wire cutting.

Figure 4C:
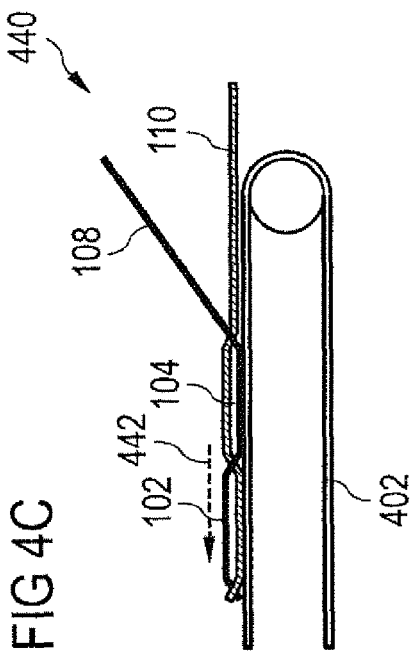
Figure 4A:
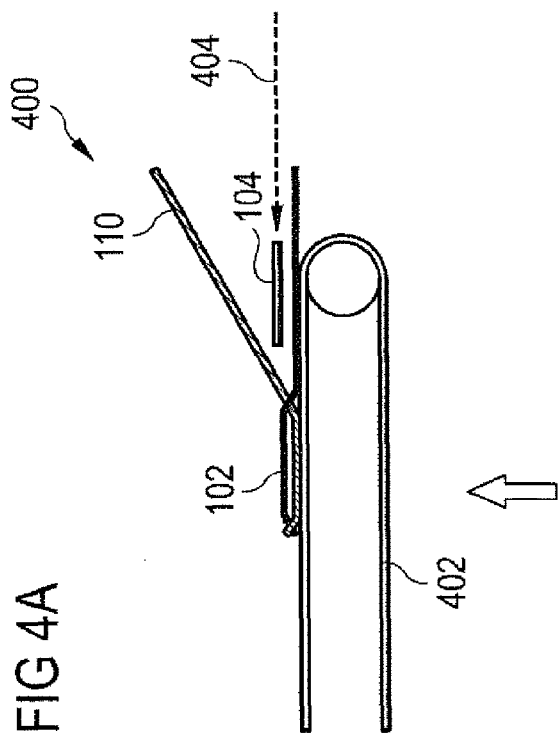

As shown in FIG. 4A in a first process state 400, the contact wire arrays 108, 110 have already been applied to the first photovoltaic cell 102, namely the first contact wire array 108 to the front of the first photovoltaic cell 102 and the second contact wire array 110 to the rear of the first photovoltaic cell 102.

The device for electrically connecting a plurality of photovoltaic cells 102, 104, 106 includes in various embodiments a photovoltaic cell string transport device, for example implemented as a conveyor belt for transporting the photovoltaic cell string during its construction. Furthermore, the device includes in various embodiments a photovoltaic cell feeding device, for example implemented as a gripping tool, by means of which the photovoltaic cells 102, 104, 106 are deposited on the conveyor belt between the contact wire arrays. Alternative implementations of the photovoltaic cell transport device will be explained in greater detail in the text which follows.

Furthermore, the two contact wire arrays 108, 110 are already run past one another in a weaving-like manner in the direction with reference to the direction of transport of the photovoltaic cell string transport device 402 and the photovoltaic cells 102, 104, 106 (symbolized by means of a first directional arrow 404 in FIG. 4A). Analogously to a weaving process, the contact wires of the two contact wire arrays 108, 110 may be considered as the warp threads. Furthermore analogously to a weaving process, the individual photovoltaic cells of the photovoltaic cell string to be formed, and thus of the photovoltaic module to be formed, may be considered as the weft threads.

The second photovoltaic cell 104 is positioned in the space formed between the two contact wire arrays 108, 110 (analogously to a weaving process) and placed at its rear onto the contact wires of the first contact wire array 108.

As shown in FIG. 4B, in a second process state 420, the contact wire arrays 108, 110 are now applied to the second photovoltaic cell 104, there having been a change of sides of the contact wire arrays and the first contact wire array 108 having been applied to the rear of the second photovoltaic cell 104 and the second contact wire array 110 having been applied to the front of the second photovoltaic cell 104. Furthermore, FIG. 4B shows that the contact wires of the contact wire arrays 108, 110 have been fixed to the contact patterns of the second photovoltaic cell 104. In the case shown here, the contact wire arrays 108, 110 are soldered to the contact patterns of the photovoltaic cell and during this process are pressed onto the respective surface of the second photovoltaic cell 104 by means of a combined holding-down/soldering device 422, or one formed from a number of single devices (the direction of pressing of the holding-down/soldering device 422 in the direction of the upper surface of the second photovoltaic cell 104 is symbolized by means of a second directional arrow 424).

In various embodiments, the electromechanical fixing of the contact wire arrays to the contact patterns by gluing or bonding is also provided.

Furthermore, the two contact wire arrays 108, 110 are run past one another in a weaving-like manner for a further time in vertical direction with reference to the direction of transport of the photovoltaic cell transport device 402 and the photovoltaic cells 102, 104, 106 (symbolized by means of a third directional arrow 426 in FIG. 4B).

As is shown in FIG. 4C, in a third process state 440, the photovoltaic cells already located on the photovoltaic cell transport device 402, namely the first photovoltaic cell 102 and the second photovoltaic cell 104 are transported further in a direction symbolized by means of a fourth directional arrow 442 (to the left in FIG. 4C) with the aid of the photovoltaic cell (string) conveyor belt 402 (photovoltaic cell string advance).

Figure 4D:
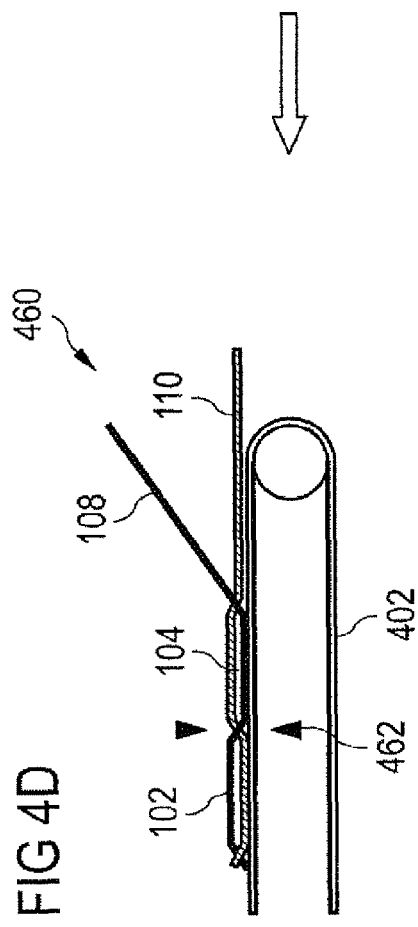

As shown in FIG. 4D, in a fourth process state 460, the contact wires of in each case one contact wire array 108, 110 are then cut through, for example by means of a contact wire cutting device 462 as will still be explained in greater detail in the text which follows. This means that either only the contact wires of the first contact wire array 108 or only the contact wires of the second contact wire array 110 are cut through in this process step so that an electrical connection, namely a series circuit between in each case two mutually adjacent photovoltaic cells 102, 104 remains by means of the contact wires not cut through; the short circuit of a photovoltaic cell resulting from the manner of contacting is removed by this cutting-through.

Descriptively, the two contact wire arrays 108, 110 are changed with each photovoltaic cell 104 processed from the front to the rear and conversely in parallel with, in other words simultaneously with, the soldering step of the previous photovoltaic cell 102 or optionally only following the soldering step of the previous photovoltaic cell 102. In this process, the respective new photovoltaic cell 104 is enclosed by the two contact wire arrays 108, 110.

Figure 6:
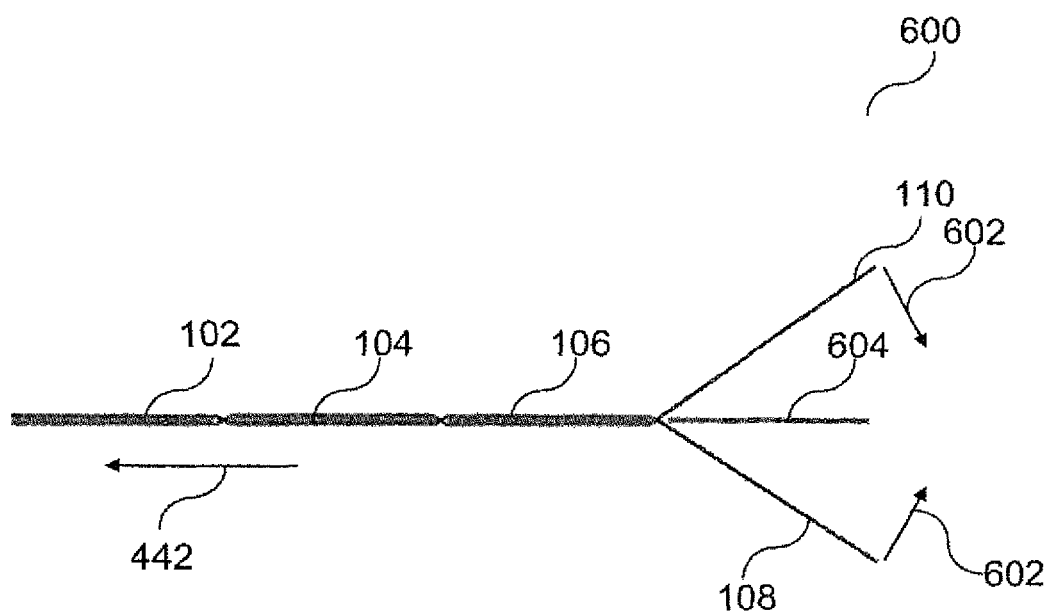
FIG. 6 shows a sketch for describing a photovoltaic cell positioning between two band-open contact wire arrays and a contact wire array change according to one embodiment.

FIG. 6 shows the structure of the photovoltaic cell interconnection for a number of photovoltaic cells after their positioning. By repeating the process, a basically endless photovoltaic cell string is produced continuously.

Thus, this process described in FIG. 4A to FIG. 4D may be carried out repeatedly, in general with an arbitrary number of repetitions so that a photovoltaic cell string of the required length is formed in the manner described.

FIG. 5 shows a flowchart 500 in which a method for electrically connecting a plurality of photovoltaic cells according to one embodiment is shown.

According to various embodiments, the method includes in 502 arranging of photovoltaic cells and cross connectors to form a photovoltaic cell string.

The method may also include in 504 positioning and applying of the first plurality and the second plurality of contact wires to the first side (for example front or rear) or second side (the respective other side) of the photovoltaic cells and cross connectors and during this process coating of the contact wires, if necessary.

In 506, cutting-through of the first plurality of contact wires and of the second plurality of contact wires between two photovoltaic cells and between photovoltaic cells and cross connectors may be provided.

The method may also include in 508 arranging of a number of photovoltaic cell strings to form one photovoltaic module matrix.

In 510, contacting of the cross connectors may also be carried out.

Furthermore, in 512, embedding of the photovoltaic module matrix and (final) production to form a photovoltaic module may be carried out.

In the text which follows, some method steps of various embodiments will be described in greater detail and other method steps will be explained which necessarily or also optionally support the basic method.

The method may include the following steps:
 1. Photovoltaic cell inspection;
 2. Contact wire handling;
 3. Contact wire functionalizing;
 4. Photovoltaic cell deposition and photovoltaic cell positioning;
 5. Implementation of photovoltaic cell string start and photovoltaic cell string end;
 6. Connecting step;
 7. Contact wire and cross connector cutting;
 8. Matrix placement and cross-interconnection; and 9. Embedding the photovoltaic cell matrix and producing the photovoltaic module.

The sequence of process steps as described is only to be considered as an example and should not be considered to be restrictive with respect to the invention. The individual processes themselves are optional and the order of individual process steps may be changed arbitrarily in principle as far as is meaningful.

In various embodiments, a photovoltaic cell inspection is carried out. Since a replacement of damaged photovoltaic cells 102, 104, 106 in the photovoltaic cell string may only be achieved with great expenditure, the photovoltaic cells 102, 104, 106 are checked for cracks or other faults before the processing in various embodiments. This may be done, e.g. by means of a defined stress test by means of ultrasound/vibration, bending etc. Furthermore, a visual inspection of the photovoltaic cells 102, 104, 106 by means of various techniques of image processing is provided in various embodiments.

Furthermore, contact wire handling is carried out in various embodiments. To be able to perform an exchange of the contact wire array as rarely as possible in order to minimize the holding times, relatively large contact wire reels (as implementation of one or more contact wire feeding devices) (weight, for example, approximately 0.5 kg to approximately 25 kg, contact wire length for example approximately 1 km to approximately 1000 km) can be used in various embodiments. The contact wire is therefore actively conveyed or actively rolled off in various embodiments in order to reduce an action of force on the contact wire and the photovoltaic cells (for example solar cells). To carry out the exchange of contact wire array in a rapid and uncomplicated manner, the contact wire exchange can take place per exchange facility (also called "Swap Kit"). Thus, in the simplest case, it is provided in various embodiments to use, for stabilizing and fixing the fitting contact wire spacing on contact wire arrays attached to a cross connector or a comparable unit, e.g. by soldering, gluing etc., which arrays are introduced in a single step into the plant for assembly of the contact wires. In order to facilitate the connecting and positioning step of the contact wires for the "Swap Kit", a comb-shaped unit can be used, e.g., for supporting the threading-in of the contact wires.

Furthermore, in various embodiments, a contact wire functionalization is carried out. The contact wires or the entire contact wire array, respectively, may be optionally functionalized in that it is coated by continuously immersing it or spraying it with a flux agent for a following soldering process, using a presoldered contact wire. Covering an unsoldered contact wire with solder may also be provided in various embodiments. For a bonding process, a transparent, if possible, conductive adhesive (for example methacrylate based, UV-curable) may also be applied which supports the fixing of the contact wire on the photovoltaic cell (for example a solar cell) and reduces forces acting on the contact patterns due to the process.

Figures 7A, 7B, 7C:
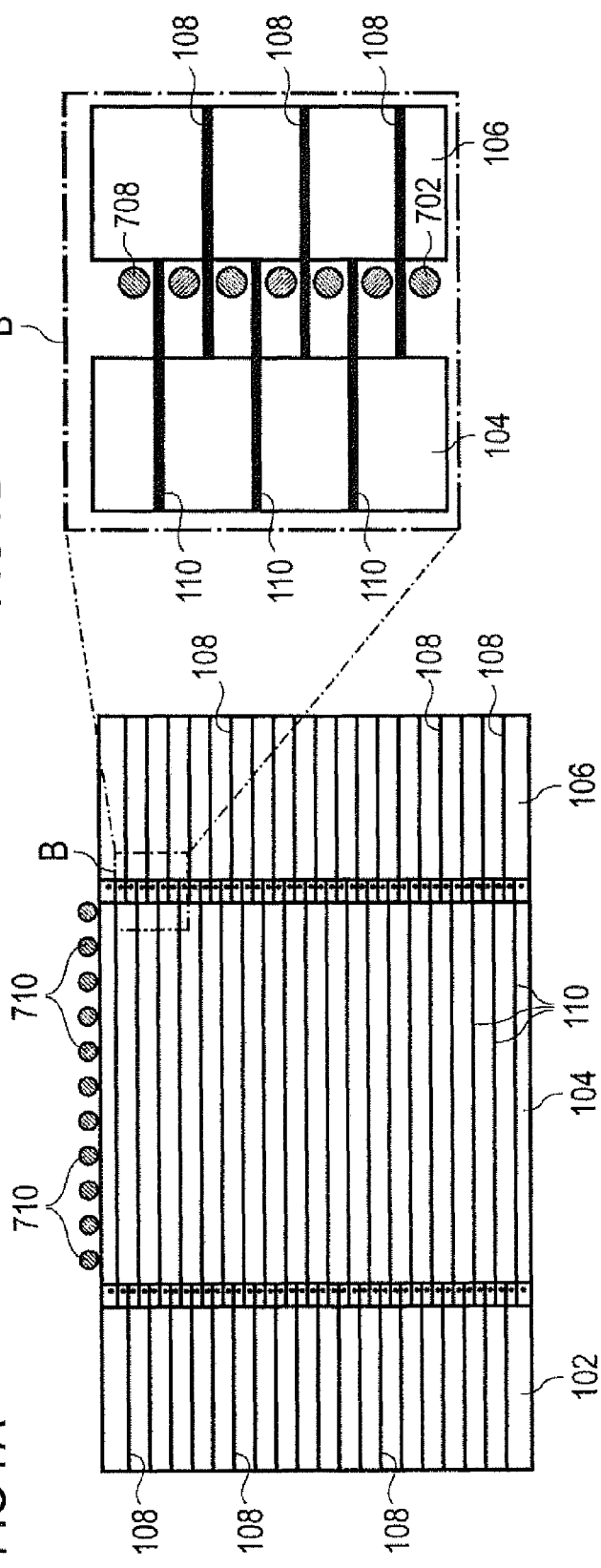
FIGS. 7A to 7C show a section and a part-piece of a conveyor belt with comb-like patterns for contact wire positioning and photovoltaic cell positioning according to one embodiment.

Furthermore, a photovoltaic cell deposition and photovoltaic cell positioning is carried out in various embodiments. By means of a suitable gripping tool, the photovoltaic cells 102, 104, 106, 604 (for example solar cells) are positioned, for example, laterally between the two opened (in other words spanned-open) contact wire arrays 108, 110 and deposited as is shown, for example, in sketch 600 in FIG. 6. Furthermore, a weaving-like contact wire change is shown by means of directional arrows 604. The lateral positioning of the contact wires can take place, for example, by means of stops, e.g. by means of two comb-shaped units 702, 704 arranged perpendicularly to one another (compare positioning arrangement 700 with indentations 706 for receiving the photovoltaic cells 102, 104, 106, 602 in FIG. 7A to FIG. 7C). In various embodiments, an embodiment is provided in which both the contact wire run (each contact wire always runs between two pins 708) and the precise photovoltaic cell positioning (position in the photovoltaic cell string and distance from the next photovoltaic cell) are supported by means of short guide pins (cones). Lateral guide pins 710 fix the lateral position of the respective photovoltaic cell. In various embodiments, it is also provided to use the comb-shaped units 702, 704 for shifting the photovoltaic cells 102, 104, 106, 602 inserted between the contact wire arrays 108, 110 but only roughly prepositioned, into a final position. This procedure has the advantage, for example, that the photovoltaic cell string is mechanically fixed and stabilized up to the connecting step (or also subsequently). The stops 702, 704 may have other functions in various embodiments, such as, e.g., to bring and hold the photovoltaic cells not only laterally in position but also prevent a lifting of the photovoltaic cells from the surface of the conveyor belt 402 during the change of contact wire array. In various embodiments, however, positioning of the photovoltaic cells by means of optical systems is also provided. The transportation of the photovoltaic cell string may take place by means of flexible conveyor belts 402 or also by means of semi-rigid circulating flexibly connected units, each of which in each case accommodates a single photovoltaic cell. The conveyor belts 402 may be preheated in order to support a possible soldering process and to cool the photovoltaic cell string slowly and in a defined manner after the soldering.

Furthermore, an implementation of photovoltaic cell string start and photovoltaic cell string end is carried out in various embodiments. By repeating the process, an, in principle, endless photovoltaic cell string is continuously produced which may be interrupted, e.g. by inserting removable photovoltaic cell dummy cells or similar units such as non-solderable rails etc., and brought to the length necessary for the photovoltaic module production. These photovoltaic cell dummy units consist, for example, of a material which cannot be connected in the joining method applied such as, e.g. ceramics, PTFE or anodized Al in a soldering process. After separating and removing the photovoltaic cell dummies, a separated photovoltaic cell string is present. In various embodiments, it may be provided to integrate parts of the transverse interconnection for generating the photovoltaic cell string start and photovoltaic cell string end by inserting cross connectors instead of the photovoltaic cell dummy units as a result of which the protruding of loose contact wire ends after the cutting of contact wires is avoided and the subsequent handling of the photovoltaic cell string is facilitated.

Furthermore, a connecting step is carried out in various embodiments. Contact wire array and photovoltaic cell are connected over as large an area as possible by soldering methods (e.g. contact soldering, induction soldering or application of hot air) or alternatively, e.g. by bonding or adhesion. When a soldering method is used, a solder-covered wire is first coated with a flux agent in various embodiments, e.g. in that the contact wire array is passed through a tub with a flux agent or flux agent is sprayed on. During the soldering process, a soft holding-down device 422 or an array of small pistons is provided which hold the contact wires fixed on the photovoltaic cell until the solder solidifies. This process step may take place in each case directly after the positioning of the individual photovoltaic cells or only after a multiplicity of photovoltaic cells have been placed to form a photovoltaic cell string (for example a solar cell string). In various embodiments, it is provided to use a contacting process (e.g. soldering) at the same time for fixing the photovoltaic cell and the contact wire array 108, 110 on the conveyor belt 402 and to facilitate the necessary change of contact wire array by executing the latter as long as the holding-down device 422 fixes the photovoltaic cell and the contact wire array on the conveyor belt 402.

Furthermore, cutting of contact wire and cross connector is carried out in various embodiments. To bring the photovoltaic cells, which are still short-circuited up to then, into an electrically meaningful series circuit, superfluous contact wire bridges are removed in various embodiments. For this purpose, each second contact wire array in the photovoltaic cell intermediate spaces is alternately interrupted. In this process, the cutting device could be adjusted by means of the photovoltaic cell edges using a camera system. In various embodiments, a rigid structure of the stringing arrangement is provided at which the cutting device may be mounted and facilitates its positioning and renders complex inspection and correction systems superfluous.

The cutting of the contact wires can take place mechanically free of tension with a self-centering device, e.g. by cutting or stamping. However, attention must be paid that no or only slight forces are exerted on the photovoltaic cell or the soldering joint (see FIG. 8A and FIG. 8B).

FIG. 8A and FIG. 8B show a representation of a mechanical contact wire cutting device 462 in longitudinal section view 800 (FIG. 8A) and cross-sectional view 820 (FIG. 8B) according to one embodiment.

The contact wire cutting device 462 may include one or more cutting devices or stamping devices 802, for example two blades 804, 806 which are opposite one another and may be joined together, which, with the joining together (symbolized in FIG. 8A by means of six directional arrows 810), cuts through the contact wire 808 arranged between the blades 804, 806 of the first contact wire array 108 or of the second contact wire array 110 respectively. The number of blades 804, 806 may be equal to the number of contact wires 808 of a contact wire array 108, 110 or different from the number of contact wires 808 of a contact wire array 108, 110. If the number of blades 804, 806 is smaller than the number of contact wires 808 of a contact wire array 108, 110, the blades 804, 806 may be moved in a transverse direction to the longitudinal direction of the contact wires 808 and driven in such a manner that the individual contact wires 808 of the contact wire array 108, 110 to be cut through are possibly "approached" successively and cut through. Furthermore, FIG. 8A shows a distance arrow 810 which symbolizes the distance between two contact wires of different contact wire arrays 108, 110. In various embodiments, the cutting devices or stamping devices 802 may be moved by this distance in the transverse direction relative to the contact wires 808 in order to in each case approach, and then to cut through, either the contact wires 808 of the first contact wire array 108 or the contact wires 808 of the second contact wire array 110.

As an alternative to mechanically cutting, excess contact wires could also be removed by means of a laser system. In the case of laser cutting, attention should be paid that separated electrically conductive material does not become deposited on the respective photovoltaic cell and short-circuit the latter via the photovoltaic cell edge. To avoid this, an electrical insulating layer, e.g. of PMMA/MMA mixtures, previously applied over the photovoltaic cell edge, which, e.g. may be applied by a soft roller on the photovoltaic cell edge and cured by means of UV radiation, is provided in some embodiments.

The cut-out contact wire pieces should be removed from the photovoltaic cell string, e.g. by compressed air or by being sucked off, which ensures that they do not pass into the later photovoltaic module and are also laminated—otherwise there would be a risk of short circuits. In various embodiments, an inspection system is provided for this which detects contact wires which have not been cut or only incompletely so, in order to provide for post processing. In various embodiments, the projection of the photovoltaic cell intermediate space or also of the entire photovoltaic cell string or of the lay-up onto a diffusely transparent surface with corresponding image acquisition and evaluation is provided.

Furthermore, matrix placement and transverse interconnection is carried out in various embodiments. Individual photovoltaic cell strings may also be produced individually and subsequently placed and interconnected to form a photovoltaic cell matrix of photovoltaic cell strings. However, alternative methods and interconnection types are also provided in alternative embodiments. Thus, the photovoltaic cell strings could be produced with short cross connectors on both sides, the photovoltaic cell matrix placement and interconnection of the photovoltaic cell string with one another now only taking place by adding corresponding spacers between the cross connectors. Similarly, it is provided in various embodiments to install the photovoltaic cell strings transversely in the photovoltaic module.

Furthermore, embedding of the photovoltaic cell matrix and manufacture of the photovoltaic module is carried out in various embodiments. Embedding takes place by means of lamination methods normally used per se. In various embodiments, however, alternative embedding variants are also provided. The framing, attachment of connecting sockets etc. is also carried out in accordance with conventional steps of module manufacture.

Thus, the photovoltaic module according to various embodiments is completed.

Figure 9:
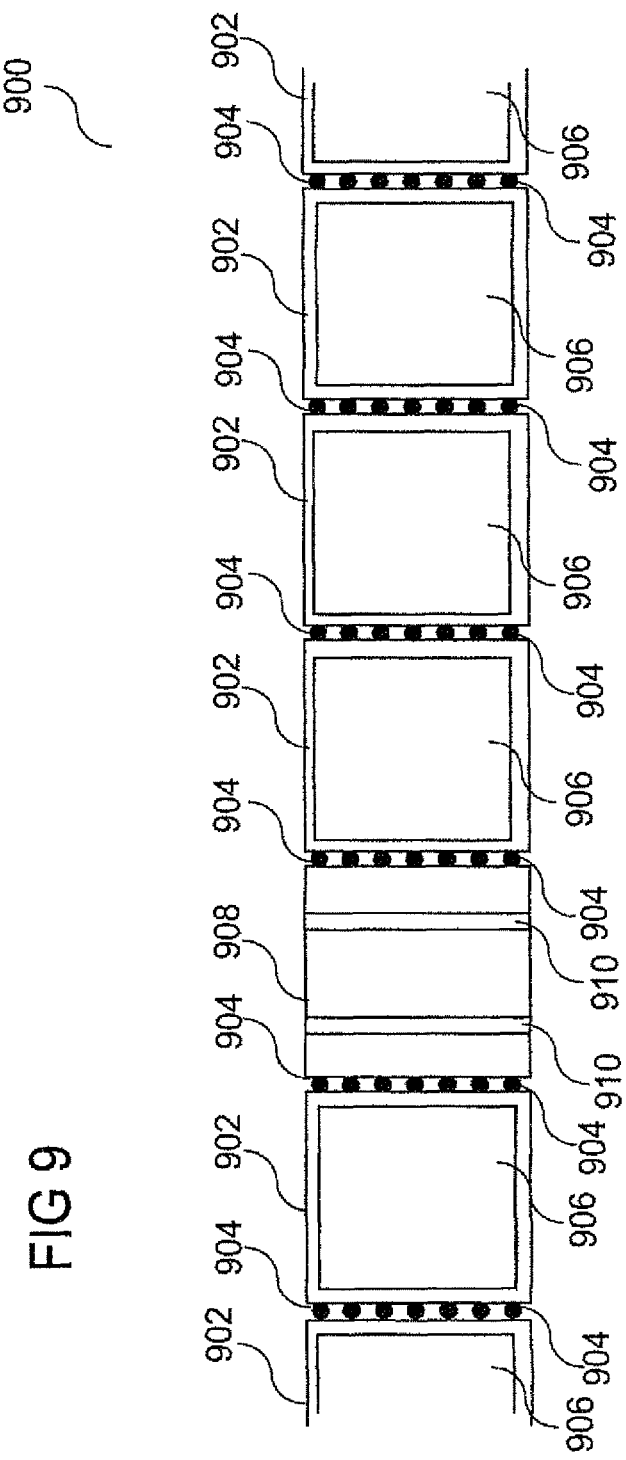
FIG. 9 shows a section of a semi-rigid chain conveyor for receiving a plurality of photovoltaic cells according to one embodiment.

FIG. 9 shows a section 900 of a semi-rigid chain conveyor for receiving a plurality of photovoltaic cells according to one embodiment.

In various embodiments, the photovoltaic cell string is continuously built up on a chain of moveably supported but intrinsically rigid part-elements 902. Arranging the photovoltaic cells in the direction of production and transverse direction can again be carried out by two comb-shaped units 904 arranged perpendicularly to one another. Thus, it is provided in various embodiments to incorporate the comb-shaped positioning unit 904 directly into the chain links 902 or to deposit the photovoltaic cells in corresponding conical indentations 906 of the chain links 902 as a result of which the positioning is automatic. The contact wire run could also take the form of guide slots in the chain links 902. Compared with a flexible conveyor belt 402, this possibility of implementation has the advantage that the accuracy of positioning of the photovoltaic cells on a chain is increased by the firm connection of the photovoltaic cell positioning and wire guiding unit 904 to the chain links 902. Other functions such as the fixing and tempering of the photovoltaic cells and the later mechanical cutting of contact wires and cross connectors can also be integrated into the individual chain links 902. The start and end of the photovoltaic cell string are inserted into the cross connectors by a deviating plate 908 or by inserting a photovoltaic cell dummy 906.

FIG. 9 shows a view of a section 900 from a semi-rigid chain conveyor, individual plates 902 have indentations 904 for receiving the photovoltaic cells, between the photovoltaic cells there are pins 904 for the contact wire run, a connecting plate 908 has two gaps or grooves 910 for receiving cross connectors for terminating the photovoltaic cell string, the number of chain links 902 is n×(photovoltaic cell number in photovoltaic cell string+1 in various embodiments, where n=1, 2, 3, . . . ), no photovoltaic cells and no contact wire arrays are shown in FIG. 9.

Figure 10:
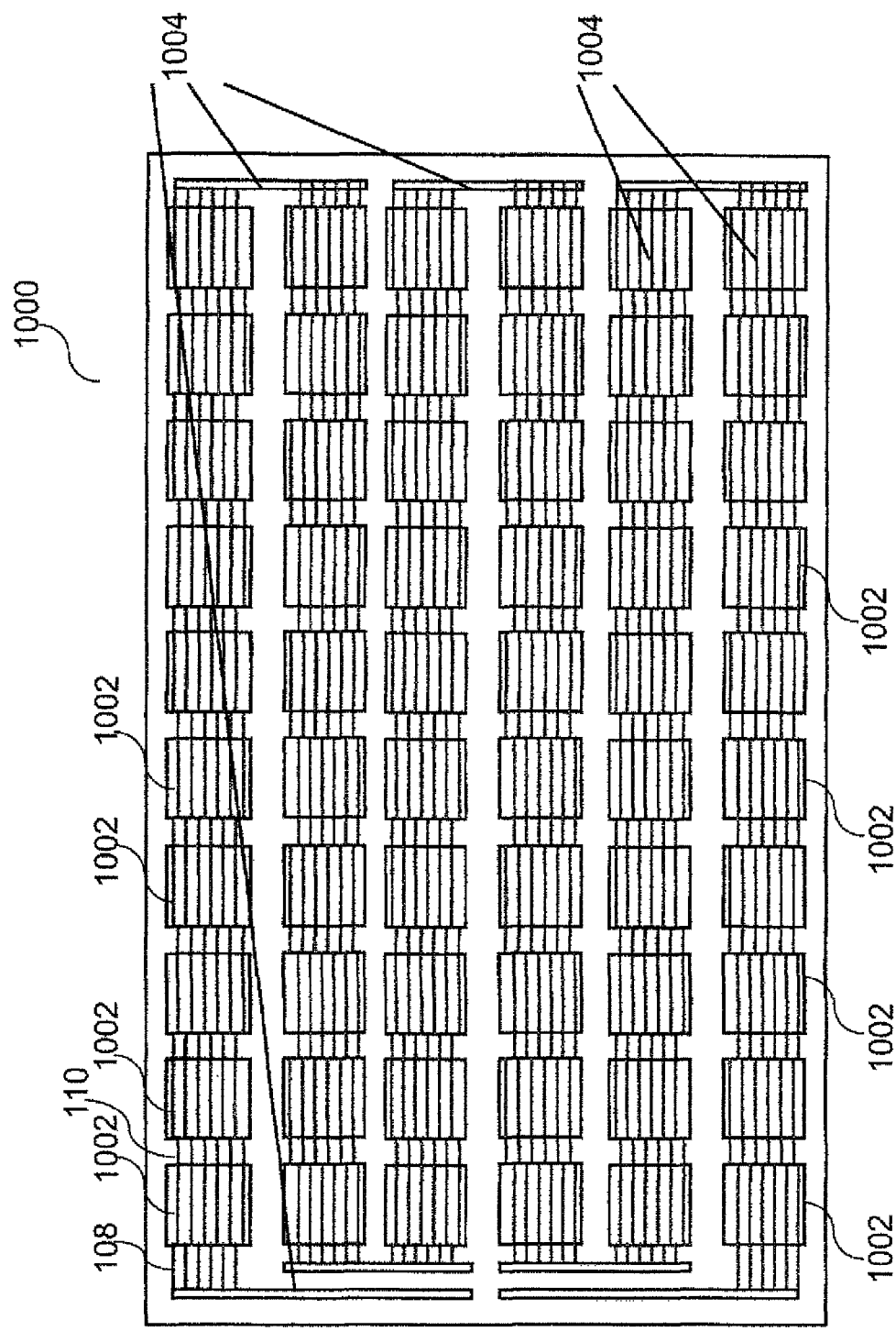
FIG. 10 shows a matrix for depositing and positioning photovoltaic cells and for running contact wires for contacting the photovoltaic cells with one another and with cross connectors according to one embodiment.

FIG. 10 shows a matrix 1000 for depositing and positioning photovoltaic cells and for guiding contact wires for bringing the photovoltaic cells in contact with one another and with cross connectors according to one embodiment.

The embodiments with a linear string interconnection of photovoltaic cells may also be expanded into a second dimension in various embodiments in that two or possibly all photovoltaic cell strings for one photovoltaic module are pre-placed in a two-dimensional matrix 1000, soldered together in parallel and cut. Thus, the production strips of photovoltaic cell string interconnection and matrix placement/transverse interconnection are combined in one device in various embodiments.

As a receiving device for the photovoltaic cells, a thread pattern in the dimension of the later photovoltaic cell matrix is provided which exhibits conical indentations 1002 which receive the photovoltaic cells and exhibits slots or cones (not shown in FIG. 10) for the contact wire run. At the edges of each photovoltaic cell matrix 1000, cross connectors would be inserted into corresponding holders 1004 and fixed with suitable clamps. On the cross connectors, the contact wire array is fixed and the process of contacting the cells is begun or continued, respectively. This capability facilitates the start of the weaving process, the first cross connector with soldered or adhesively joined contact wires can serve as "Swap Kit" and be inserted manually in order to minimize holding times. Following this, the photovoltaic cell matrix 1000 is built up and excessive contact arrangements of photovoltaic cell and cross connectors are cut out of the photovoltaic cell matrix 1000 simultaneously or also step-by-step. After a photovoltaic cell matrix 1000 has been produced, it is moved by one matrix length, a new photovoltaic cell matrix 1000 is placed and the process is continued. The interconnected photovoltaic cells are taken from the produced photovoltaic cell matrix 1000 and a lay-up is placed for the photovoltaic module production. FIG. 10 shows a possible photovoltaic cell matrix 1000 with cross connectors, interconnection and wire connections already cut out.

Openings at suitable places in the photovoltaic cell matrix 1000 could facilitate the precise cutting, the removal of cut-out wire and cross connector pieces and the inspection of the connected photovoltaic cells. Apart from the positioning of cross connectors, protective diodes could be additionally inserted into the photovoltaic cell matrix 1000 and contacted in parallel with the photovoltaic cells, e.g. by soldering.

In various embodiments, the photovoltaic cells of the photovoltaic module could have a square shape. However, in various embodiments, the photovoltaic cells of the photovoltaic module could also exhibit a non-square shape with correspondingly shaped indentations or centering devices within the photovoltaic cell matrix 1000 or also of the semi-rigid chain conveyor 900. In these cases, the photovoltaic cells of the photovoltaic module can be formed, for example, by separating of (for example cutting) and thus splitting one or more square-shaped (also called standard photovoltaic cell in the form thereof) photovoltaic cell(s) to form a number of non-square photovoltaic cells.

Furthermore, it can be provided in various embodiments that not only one photovoltaic cell string is contacted in a common process step (in other words simultaneously) but an entire photovoltaic cell matrix or a part of a photovoltaic cell matrix which is larger than a single photovoltaic cell string is contacted in a common process step (in other words simultaneously).

In various embodiments, a photovoltaic module (for example a solar module) is provided. The photovoltaic module may have a number of photovoltaic cells (for example a number of solar cells). At least one of the photovoltaic cells may have: a first plurality of contact wires on a front of the photovoltaic cell; and a second plurality of contact wires on a rear of the photovoltaic cell; the first plurality of contact wires and the second plurality of contact wires being arranged offset with respect to one another.

According to one embodiment, the first plurality of contact wires and the second plurality of contact wires are arranged offset with respect to one another in such a manner that they cannot overlap or touch laterally. In other words, the first plurality of contact wires and the second plurality of contact wires can be arranged offset in parallel with one another.

According to one development, the first plurality of contact wires and the second plurality of contact wires can be arranged offset with respect to one another by at least the diameter of one contact wire, for example offset by approximately one half of the distance of two contact wires from one another. According to various embodiments, the first plurality of contact wires and the second plurality of contact wires can be arranged offset from one another by a distance of approximately 0.1 mm to approximately 25 mm, for example by a distance of approximately 1.5 mm to approximately 15 mm.

According to another development, the photovoltaic cells of the photovoltaic module can also exhibit a contact pattern on the front of the respective photovoltaic cell; the first plurality of contact wires being arranged at least partially on the contact pattern. In principle, the contact wires can be arranged at an arbitrary angle to the contact pattern, for example longitudinally (i.e. descriptively essentially in parallel with the contact patterns) or at an angle of 90° (i.e. descriptively essentially perpendicularly to the contact patterns) to the contact pattern.

It should be pointed out that the photovoltaic cells exhibit an adapted design of the contact patterns in various embodiments. Thus, it is no longer necessary to apply any busbars in various embodiments and they are thus not provided in various embodiments. Furthermore, the previous rear of the photovoltaic cell may similarly be adapted in various embodiments and has, for example, contact patterns extending transversely to the contact wires applied later.

According to yet another development, the contact pattern may exhibit a plurality of electrically conductive contact fingers.

The first plurality of contact wires may be attached to the front of the photovoltaic cell, wherein the second plurality of contact wires may be attached to the rear of the photovoltaic cell.

In this case, it is provided in various embodiments that the first plurality of contact wires, when they are attached to the front of the photovoltaic cell, are in each case attached to the rear of the adjacent electrically contacted photovoltaic cell, and conversely.

The first plurality of contact wires may be attached by means of a solder joint and/or by means of a bonding joint and/or by means of an adhesive joint on the front (in other words the emitter side or the solar side) of the photovoltaic cell.

One or more edge areas of the photovoltaic cell may be coated with an electrically insulating material.

In various embodiments, a photovoltaic module is provided. The photovoltaic module may have a plurality of photovoltaic cells, a plurality of contact wires being arranged on a front of each photovoltaic cell, the plurality of contact wires of in each case mutually adjacent photovoltaic cells being arranged offset with respect to one another.

At least some of the photovoltaic cells of the photovoltaic module may in each case include: a front and a rear; a first plurality of contact wires on the front of the photovoltaic cell; a second plurality of contact wires on the rear of the photovoltaic cell; the first plurality of contact wires and the second plurality of contact wires being arranged offset with respect to one another.

According to one embodiment, the plurality of contact wires and the second plurality of contact wires are arranged offset with respect to one another in such a manner that they do not overlap and do not touch laterally. In other words, the first plurality of contact wires and the second plurality of contact wires can be arranged offset in parallel with one another.

According to one development, the first plurality of contact wires and the second plurality of contact wires may be arranged offset with respect to one another by at least the diameter of one contact wire, for example offset by approximately one half of the distance of two contact wires from one another. According to various embodiments, the first plurality of contact wires and the second plurality of contact wires may be arranged offset from one another by a distance of approximately 0.1 mm to approximately 25 mm, for example by a distance of approximately 1.5 mm to approximately 15 mm.

At least some of the photovoltaic cells of the photovoltaic module may in each case exhibit: a contact pattern on the front of the respective photovoltaic cell; the first plurality of contact wires being arranged at least partially on the contact pattern. In principle, the contact wires may be arranged at an arbitrary angle to the contact pattern, for example longitudinally (i.e. descriptively essentially in parallel with the contact patterns) or at an angle of 90° (i.e. descriptively essentially perpendicular to the contact patterns) to the contact pattern.

According to yet another development, the contact pattern may include a plurality of electrically conductive contact fingers.

In at least some of the photovoltaic cells of the photovoltaic module: the first plurality of contact wires in each case may be attached to the front of the photovoltaic cell; and the second plurality of contact wires may in each case be attached to the rear of the photovoltaic cell.

In at least some of the photovoltaic cells of the photovoltaic module, the first plurality of contact wires may be attached in each case on the front of the photovoltaic cell by means of a solder joint and/or by means of a bonding joint and/or by means of an electrically conductive adhesive joint.

In at least some of the photovoltaic cells of the photovoltaic module, one or more edge areas of the respective photovoltaic cell may be provided in each case with an electrically insulating layer.

According to various embodiments, a method for electrically connecting a plurality of photovoltaic cells is provided. The method may include: applying a first plurality of contact wires to a front of a first photovoltaic cell; applying a second plurality of contact wires to a rear of the first photovoltaic cell; applying the first plurality of contact wires to a rear of a second photovoltaic cell; and applying the second plurality of contact wires to a front of the second photovoltaic cell; the first plurality of contact wires and the second plurality of contact wires being arranged offset with respect to one another.

The first plurality of contact wires and the second plurality of contact wires may be run past one another, for example in a weaving-like manner, between the first photovoltaic cell and the second photovoltaic cell.

The plurality of contact wires of mutually adjacent photovoltaic cells can be arranged offset with respect to one another in each case in such a manner that they do not overlap or touch laterally. In other words, the plurality of contact wires of in each case mutually adjacent photovoltaic cells may be arranged offset with respect to one another in parallel.

The plurality of contact wires of in each case mutually adjacent photovoltaic cells can be arranged offset with respect to one another by at least the diameter of one contact wire, for example offset with respect to one another by approximately one half of the distance of two contact wires. According to one embodiment, the plurality of contact wires of in each case mutually adjacent photovoltaic cells may be arranged offset with respect to one another by a distance of approximately 0.1 mm to approximately 25 mm, for example by a distance of from approximately 1.5 mm to approximately 15 mm.

In at least some of the photovoltaic cells of the photovoltaic module, a contact pattern or a number of contact patterns may be applied to the front of the photovoltaic cell(s), the first plurality of contact wires being arranged at least partially on the contact pattern. In principle, the contact wires may be arranged at an arbitrary angle to the contact pattern, for example longitudinally (i.e. descriptively essentially in parallel with the contact patterns) or at an angle of 90° (i.e. descriptively essentially perpendicularly to the contact patterns) to the contact pattern.

In various embodiments, a contact pattern or a number of contact patterns may be applied to the rear of the photovoltaic cell(s) in at least some of the photovoltaic cells of the photovoltaic module.

The contact pattern may have a plurality of electrically conductive contact fingers.

In at least some of the photovoltaic cells of the photovoltaic module, the plurality of contact wires may be attached in each case to the photovoltaic cell.

In at least some of the photovoltaic cells of the photovoltaic module, the plurality of contact wires may be attached in each case to the photovoltaic cell by means of soldering and/or by means of bonding and/or by means of adhesion.

Between the first photovoltaic cell and the second photovoltaic cell, the first plurality of contact wires may be cut through.

The cutting-through can be carried out by means of a laser or by means of a mechanical cutting device, for example in a low-tension or tension-free manner In at least some of the photovoltaic cells of the photovoltaic module, an edge area of the respective photovoltaic cell may be provided in each case with an electrically insulating layer.

According to various embodiments, a device for electrically connecting a plurality of photovoltaic cells is provided. The device may exhibit a contact wire supply device for supplying a multiplicity of contact wires; and a device arranged for applying a first plurality of contact wires to a front of a first photovoltaic cell; for applying a second plurality of contact wires to a rear of the first photovoltaic cell; for applying the first plurality of contact wires to a rear of a second photovoltaic cell; and for applying the second plurality of contact wires to a front of the second photovoltaic cell, the device also being arranged in such a manner that the first plurality of contact wires and the second plurality of contact wires are arranged offset with respect to one another.

The contact wires may include a metal, for example nickel, copper, aluminum and/or silver or another suitable metal. Furthermore, the contact wires may be coated with a metal or a metal alloy, for example with silver, Sn and/or nickel and/or a solder coating including or consisting, for example, of Sn—Pb, Sn—Pb—Ag, Sn—Bi.

In various embodiments, the photovoltaic cells of the photovoltaic module may exhibit a square shape. In various embodiments, however, the photovoltaic cells of the photovoltaic module may also be non-square-shaped. In these cases, the photovoltaic cells of the photovoltaic module may be formed, for example, by separating (for example cutting) and thus splitting one or more (also called standard photovoltaic cell in the form thereof) photovoltaic cell(s) to form a number of non-square-shaped or square photovoltaic cells. In various embodiments, it may be provided in these cases to adapt the contact patterns in the standard photovoltaic cell, for example rear transverse patterns may be additionally provided.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A photovoltaic module, comprising: a plurality of photovoltaic cells, at least one first photovoltaic cell of the number of photovoltaic cells comprising:
    a first plurality of contact wires extending continuously off a rear surface of the first photovoltaic cell; and a second plurality of contact wires on a front surface of the first photovoltaic cell, wherein the second plurality of contact wires is at least 5 contact wires; the first plurality of contact wires and the second plurality of contact wires being arranged offset with respect to one another in parallel, wherein the distance in the offset from the first plurality of contact wires to the second plurality of contact wires is within a range of about 0.5 mm to about 25 mm;
    wherein at least one of said first plurality of wires extend from the rear surface of the first photovoltaic cell toward a second photovoltaic cell, and
    wherein at least one of said second plurality of wires has a round cross section and extends from the front surface of the first photovoltaic cell to a rear surface of the second photovoltaic cell,
    wherein the second photovoltaic cell further comprises on a front surface a third plurality of contact wires, at least one wire of the third plurality of contact wires extending continuously off the front surface of the second photovoltaic cell toward the first photovoltaic cell, the at least one of the third plurality of wires being substantially aligned with the at least one of a first plurality of wires extending from the back surface of a first photovoltaic cell,
    wherein the at least one of said first plurality of wires does not contact the second photovoltaic cell and the at least one of the third plurality of wires does not contact the first photovoltaic cell.

2. The photovoltaic module as claimed in claim 1, the first plurality of contact wires and the second plurality of contact wires being arranged offset with respect to one another by approximately one half of the distance of two contact wires.

3. The photovoltaic module as claimed in claim 1, further comprising: a contact pattern on the front of the first photovoltaic cell; the second plurality of contact wires being arranged at least partially at an arbitrary angle on the contact pattern.

4. The photovoltaic module as claimed in claim 3, the second plurality of contact wires being attached to the contact pattern by means of a joint selected from a group of joints consisting of: a solder joint; a bonding joint; and an electrically conductive adhesive connecting.

5. The photovoltaic module as claimed in claim 4, at least one of the first plurality of contact wires and the second plurality of contact wires being coated at least partially with solderable material.

6. The photovoltaic module as claimed in claim 5, at least one of the first plurality of contact wires and the second plurality of contact wires being coated at least partially with electrically conductive adhesive.

7. The photovoltaic module as claimed in claim 1, an edge area of the photovoltaic cell being electrically insulated.

8. The photovoltaic module as claimed in claim 1, at least one photovoltaic cell of the plurality of photovoltaic cells exhibiting a non-square shape.

9. A photovoltaic module, comprising: a plurality of photovoltaic cells, a plurality of contact wires being arranged on a front of each photovoltaic cell; the plurality of contact wires of in each case mutually adjacent photovoltaic cells being arranged offset with respect to one another, wherein a distance in the offset in the plurality of contact wires arranged on the front of adjacent photovoltaic cells is between about 0.5 mm and about 25 mm;
    wherein at least one of a first plurality of wires extend from a back surface of a first photovoltaic cell toward an adjacent second photovoltaic cell,
    wherein at least one of a second plurality of wires having a round cross section and extends from a front surface of the first photovoltaic cell to a back surface of the second photovoltaic cell,
    wherein the second plurality of contact wires comprises 5 or more contact wires,
    wherein the second photovoltaic cell further comprises on a front surface a third plurality of contact wires, at least one wire of the third plurality of contact wires extending continuously off the front surface of the second photovoltaic cell toward the first photovoltaic cell, the at least one of the third plurality of wires being substantially aligned with the at least one of a first plurality of wires extending from the back surface of a first photovoltaic cell,
    wherein the at least one of said first plurality of wires does not contact the second photovoltaic cell and the at least one of the third plurality of wires does not contact the first photovoltaic cells respectively.

10. The photovoltaic module as claimed in claim 9, at least one photovoltaic cell of the plurality of photovoltaic cells exhibiting a non-square shape.

* * * * *

UNITED STATES PATENT AND TRADEMARK OFFICE
CERTIFICATE OF CORRECTION

| | | |
|---|---|---|
| PATENT NO. | : 9,356,175 B2 | |
| APPLICATION NO. | : 13/095930 | |
| DATED | : May 31, 2016 | |
| INVENTOR(S) | : Olaf Storbeck et al. | |

It is certified that error appears in the above-identified patent and that said Letters Patent is hereby corrected as shown below:

In the specification,

Column 6, line 21: Please delete "bather" between the words "diffusion" and "layer", and write "barrier" in place thereof.

Signed and Sealed this
Ninth Day of August, 2016

Michelle K. Lee
*Director of the United States Patent and Trademark Office*